United States Patent
Ilkov et al.

(10) Patent No.: US 9,866,260 B2
(45) Date of Patent: Jan. 9, 2018

(54) SYSTEM AND METHOD FOR A DIRECTIONAL COUPLER MODULE

(71) Applicant: Infineon Technologies AG, Neubiberg (DE)

(72) Inventors: Nikolay Ilkov, Munich (DE); Daniel Kehrer, Sauerlach (DE); Valentyn Solomko, Munich (DE)

(73) Assignee: Infineon Technologies AG, Neubiberg (DE)

(*) Notice: Subject to any disclaimer, the term of this patent is extended or adjusted under 35 U.S.C. 154(b) by 150 days.

(21) Appl. No.: 14/834,208

(22) Filed: Aug. 24, 2015

(65) Prior Publication Data
US 2016/0079649 A1 Mar. 17, 2016

Related U.S. Application Data

(60) Provisional application No. 62/049,763, filed on Sep. 12, 2014.

(51) Int. Cl.
| | |
|---|---|
| *H04B 1/46* | (2006.01) |
| *H04B 1/44* | (2006.01) |
| *H04B 1/04* | (2006.01) |
| *H03H 7/48* | (2006.01) |

(52) U.S. Cl.
CPC .......... *H04B 1/44* (2013.01); *H04B 1/0458* (2013.01); *H03H 7/48* (2013.01)

(58) Field of Classification Search
None
See application file for complete search history.

(56) References Cited

U.S. PATENT DOCUMENTS

| | | | |
|---|---|---|---|
| 5,471,146 A | 11/1995 | Krayeski et al. | |
| 6,118,409 A | 9/2000 | Pietsch et al. | |
| 6,329,880 B2 * | 12/2001 | Akiya | H03F 1/56 330/207 P |
| 6,498,925 B1 * | 12/2002 | Tauchi | H03F 1/0277 455/115.1 |
| 7,440,731 B2 * | 10/2008 | Staudinger | H03F 1/0205 455/126 |
| 7,660,571 B2 * | 2/2010 | Chang | H03G 1/0088 333/81 R |

(Continued)

FOREIGN PATENT DOCUMENTS

| | | |
|---|---|---|
| CN | 103414004 A | 11/2013 |
| JP | H10267978 A | 10/1998 |
| KR | 20130070445 A | 6/2013 |

OTHER PUBLICATIONS

Bahl, I., "Lumped Elements for RF and Microwave Circuits," ISBN 1-58053-309-4, 2003, 44 pgs.

*Primary Examiner* — Tuan A Tran
(74) *Attorney, Agent, or Firm* — Slater Matsil, LLP

(57) ABSTRACT

In accordance with an embodiment, a circuit includes a first directional coupler comprising a first input port, a first transmitted port, a first isolated port and a first coupled port, where the first directional coupler disposed on a first substrate. The circuit also includes a first direction select switch having a first switch input port coupled to the first isolated port, a second switch input port coupled to the first coupled port, and a first switch output port, where the first direction select switch is disposed on the first substrate along with the directional coupler.

23 Claims, 17 Drawing Sheets

(56) References Cited

U.S. PATENT DOCUMENTS

| | | | | |
|---|---|---|---|---|
| 8,417,196 B2* | 4/2013 | Kitching | ................... | H03F 3/72 |
| | | | | 455/126 |
| 8,432,234 B2* | 4/2013 | Manssen | ................. | H03H 7/40 |
| | | | | 333/17.3 |
| 8,761,694 B2* | 6/2014 | Lorenz | ................ | H01Q 3/2605 |
| | | | | 455/103 |
| 8,811,530 B2* | 8/2014 | Lorenz | ................ | H04B 7/0617 |
| | | | | 375/260 |
| 8,975,982 B2* | 3/2015 | Park | ........................ | H04B 1/18 |
| | | | | 333/101 |
| 2014/0011461 A1* | 1/2014 | Bakalski | ............. | H04B 1/3805 |
| | | | | 455/78 |
| 2015/0002146 A1 | 1/2015 | Solomko et al. | | |
| 2015/0200437 A1 | 7/2015 | Solomko et al. | | |

\* cited by examiner

SYSTEM AND METHOD FOR A DIRECTIONAL COUPLER MODULE

This application claims priority to U.S. Provisional Application Ser. No. 62/049,763 filed on Sep. 12, 2014 and entitled "System and Method for a Directional Coupler Module," which application is hereby incorporated herein by reference in its entirety.

TECHNICAL FIELD

The present disclosure relates generally to an electronic device, and more particularly to a system and method for a directional coupler module.

BACKGROUND

Directional couplers, which are electronic devices that can detect power being transmitted in a particular direction, are used in a wide variety of radio frequency (RF) circuits. For example, a directional coupler may be used in a radar system to detect a reflected wave by separating the indecent wave from the reflected wave, or may be used in a circuit that measures the impedance mismatch of transmission lines. Functionally, a directional coupler has a forward transmission path and a coupled transmission path. The forward transmission path generally has a low loss, while the coupled transmission path couples a fraction of the transmission power that is propagated in a particular direction. There are many different types of coupler architectures that include electromagnetic couples and magnetic couplers. Each of these coupler types may be implemented using different topologies and materials depending on the frequency of operation and the operational environment.

One common application for a directional coupler is the detection of the reflected and transmitted power in a portable radio frequency (RF) device such as a cellular telephone or a portable computing device. The measurement of the transmitted power may be used in a control loop to adjust the output of a power amplifier, while the measurement of the reflected power in conjunction with the measurement of the reflected power may be used to adjust adjustable antenna matching networks. As portable RF devices become more sophisticated with respect to being able to operate over multiple frequencies using multiple standards, the topologies of the RF ends have become more complicated. For example, a multi-standard RF device may have multiple transmit and receive paths coupled to one or more antennas via a network of multiple switches, matching networks, power detectors and the like. Accordingly, the layout and construction of such portable RF devices often consume a considerable amount of printed circuit board (PCB) space.

SUMMARY

In accordance with an embodiment, a circuit includes a first directional coupler comprising a first input port, a first transmitted port, a first isolated port and a first coupled port, where the first directional coupler disposed on a first substrate. The circuit also includes a first direction select switch having a first switch input port coupled to the first isolated port, a second switch input port coupled to the first coupled port, and a first switch output port, where the first direction select switch is disposed on the first substrate along with the directional coupler.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a directional coupler that may be used, for example, in RF circuits to measure incident or reflected power. Embodiments of the present invention may also be applied to other systems and applications including other circuits that include directional couplers and RF systems with selectable signal paths. Moreover, embodiments may be directed to systems that make RF measurements including, but not limited to devices that measure and/or tune impedance mismatch, time domain reflectometers (TDR), sensing devices for use with tunable antenna matching circuits, and tunable filters.

In an embodiment of the present invention, a directional coupler module includes a directional coupler circuit disposed on a same substrate as a direction select switch. The directional coupler includes an input port and a transmitted port, as well as an isolated port on which a signal that propagates from the transmitted port to the input port is coupled, and coupled port on which a signal that propagates from the input port to the transmitted port is coupled. The direction select switch is configured to selectively route one of the isolated port and the coupled port to an output port.

Embodiment directional coupler systems may be used, for example, in RF front-end systems and front-end multi-chip modules for cellular handsets, and the various embodiments combine outputs of single or multiple directional couplers into a single output using RF switches. Such directional coupler systems, for example, may be specifically used in reconfigurable RF front-ends for cellular handsets. In some embodiments, directional coupler systems that utilize directional couplers, RF switches and attenuators may be used in RF front-end systems to sense the power transmitted from PA to antenna and the power reflected from antenna back to PA due to impedance mismatch at the various ports in the system.

Figure 1A:
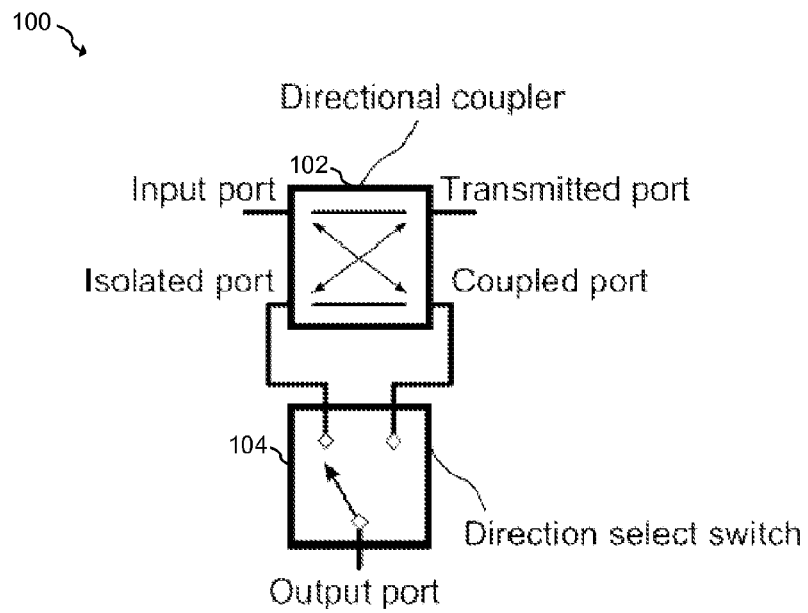
FIGS. 1a-1d illustrate embodiment directional coupler systems.

FIG. 1a illustrates a directional coupler system 100 according to an embodiment of the present invention. As shown, directional coupler system 100 includes directional coupler 102 and direction select switch 104 coupled to the isolated and coupled ports of directional coupler 102. In accordance with various embodiments, directional coupler 102 may be implemented using directional coupler circuits known in the art. For example, directional coupler 102 may be implemented using a transformer based directional coupler, a stripline directional coupler, or another type of directional coupler known in the art. In some embodiments, directional couplers may be used that are disclosed in U.S. patent application Ser. No. 14/155,130 entitled, "System and Method for a Directional Coupler," filed on Jan. 14, 2014, which application is incorporated by reference in its entirety. Direction select switch 104 may be implemented using RF switch circuits and systems known in the art.

In an embodiment, direction select switch 104 is used to select either the isolated port or the coupled port of directional coupler 102. When direction select switch 104 selects the isolated port, the output of direction select switch 104 provides a signal that is proportion to an RF signal propagating from the transmitted port to the input port. Such a signal may result, for example, from reflected RF power and may be used, for example, to measure an impedance mismatch. Conversely, when direction select switch 104 selects the coupled port, the output of direction select switch 104 provides a signal that is proportion to an RF signal propagating from the transmitted port to the input port. Such a signal may be used to measure transmitted power. In an embodiment, directional coupler 102 and direction select switch 104 may be disposed on separate integrated circuits or may be monolithically integrated on a single die. Separate chips may be integrated in a multichip module or mounted on an application printed-circuit board.

Figure 1B:
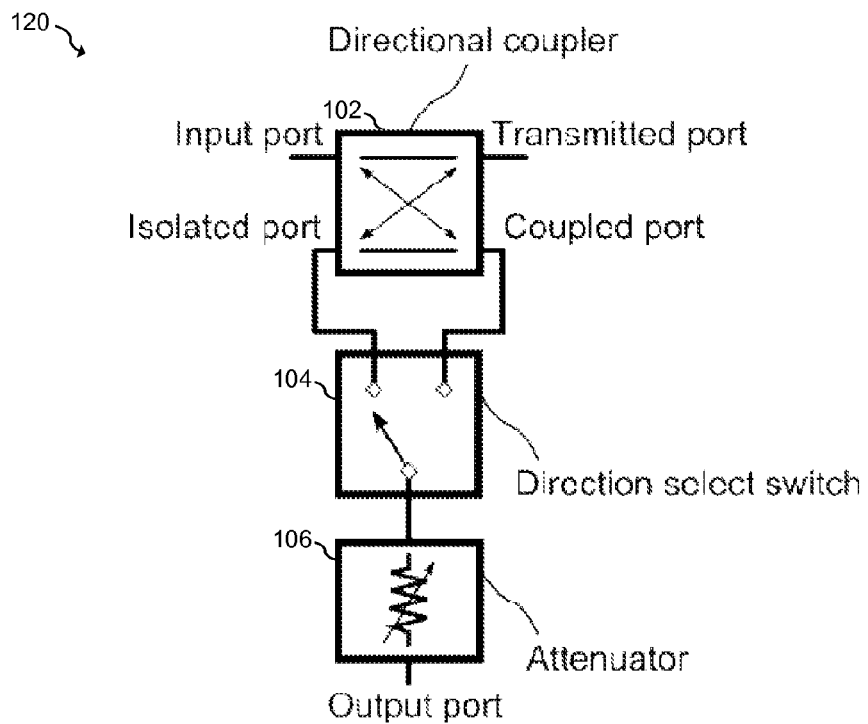

FIG. 1b illustrates directional coupler system 120 that includes directional coupler 102, direction select switch 104 and further includes attenuator 106 between direction select switch 104 and the output port. In some embodiments attenuator 106 may be adjustable using analog or digital tuning. Attenuator 106 may be monolithically integrated on the same die as directional coupler 102 and/or direction select switch 104 or may be integrated on a separate die. According to various embodiments, attenuator 106 is implemented using RF attenuator circuit and systems, known in the art.

Figure 1C:
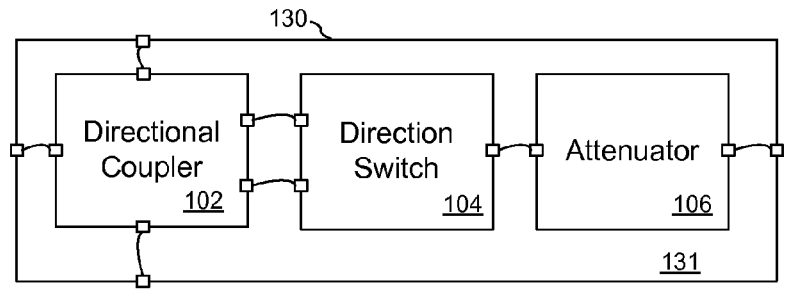

FIG. 1c illustrates a plan view of directional coupler module 130 that includes directional coupler 102, direction select switch 104 and attenuator 106 mounted on substrate 131. As shown, directional coupler 102, direction select switch 104 and attenuator 106 are each integrated on individual dice. Directional coupler 102, direction select switch 104, and attenuator 106 are bonded to each other via bond pads and to external pins. These bonding connections may be made, for example, using bump bonds, bond wires, or other bonding systems and methods known in the art. In alternative embodiments, the partitioning of these components may be different. For example, directional coupler 102 and direction select switch 104 may be integrated on a first die and attenuator 106 may be implemented on a second die. In some embodiments, directional coupler 102, direction select switch 104 and attenuator 106 may be integrated on a single die that may be disposed on substrate 131.

Figure 1D:
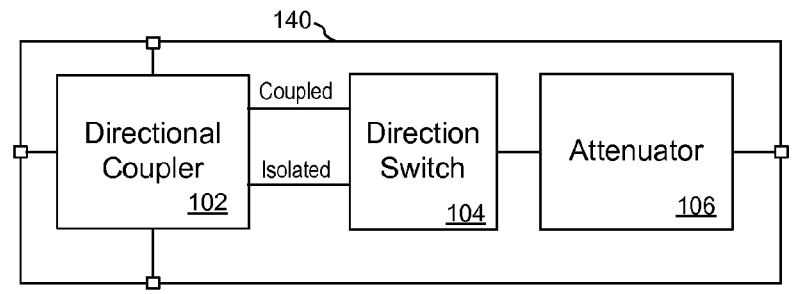

FIG. 1d illustrates an embodiment directional coupler monolithic integrated circuit 140 that includes directional coupler 102, direction select switch 104 and attenuator 106 integrated on a single die.

Figure 2:
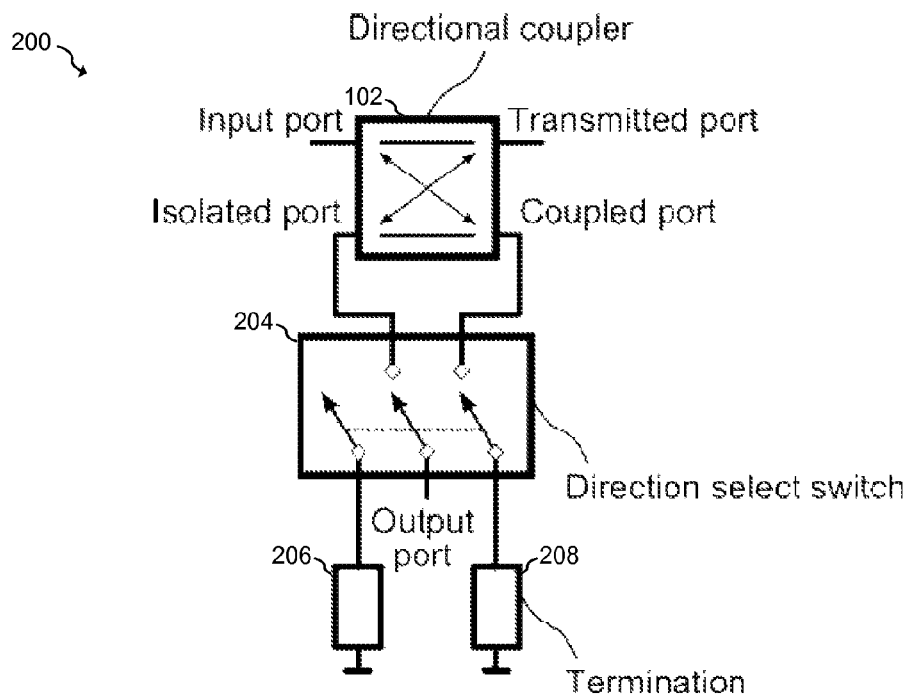
FIG. 2 illustrates an embodiment directional coupler system having termination resistors.

FIG. 2 illustrates directional coupler system 200 according to a further embodiment. As shown, directional coupler system 200 includes directional coupler 102 and direction select switch 204 loaded by termination impedances 206 and 208. Direction select switch 204 includes three switches: one switch selects between the isolated port and the coupled port of directional coupler 102, while the other two switches couple one of termination impedance 206 and termination impedance 208 to the unselected port. Termination impedances 206 and 208 may be implemented, for example, using a 50 Ohm resistor or other resistance value approximately equal to the characteristic impedance of the system. In some embodiments, termination impedance 206 and/or termination impedance 208 may be implemented using complex impedances implemented using resistors, capacitor, inductors, other device types or a combination thereof. Termination impedances 206 and/or 208 may be implemented using discrete external components or may be integrated on the same die as direction select switch 104 and/or other components within directional coupler system 200.

Figure 3A:
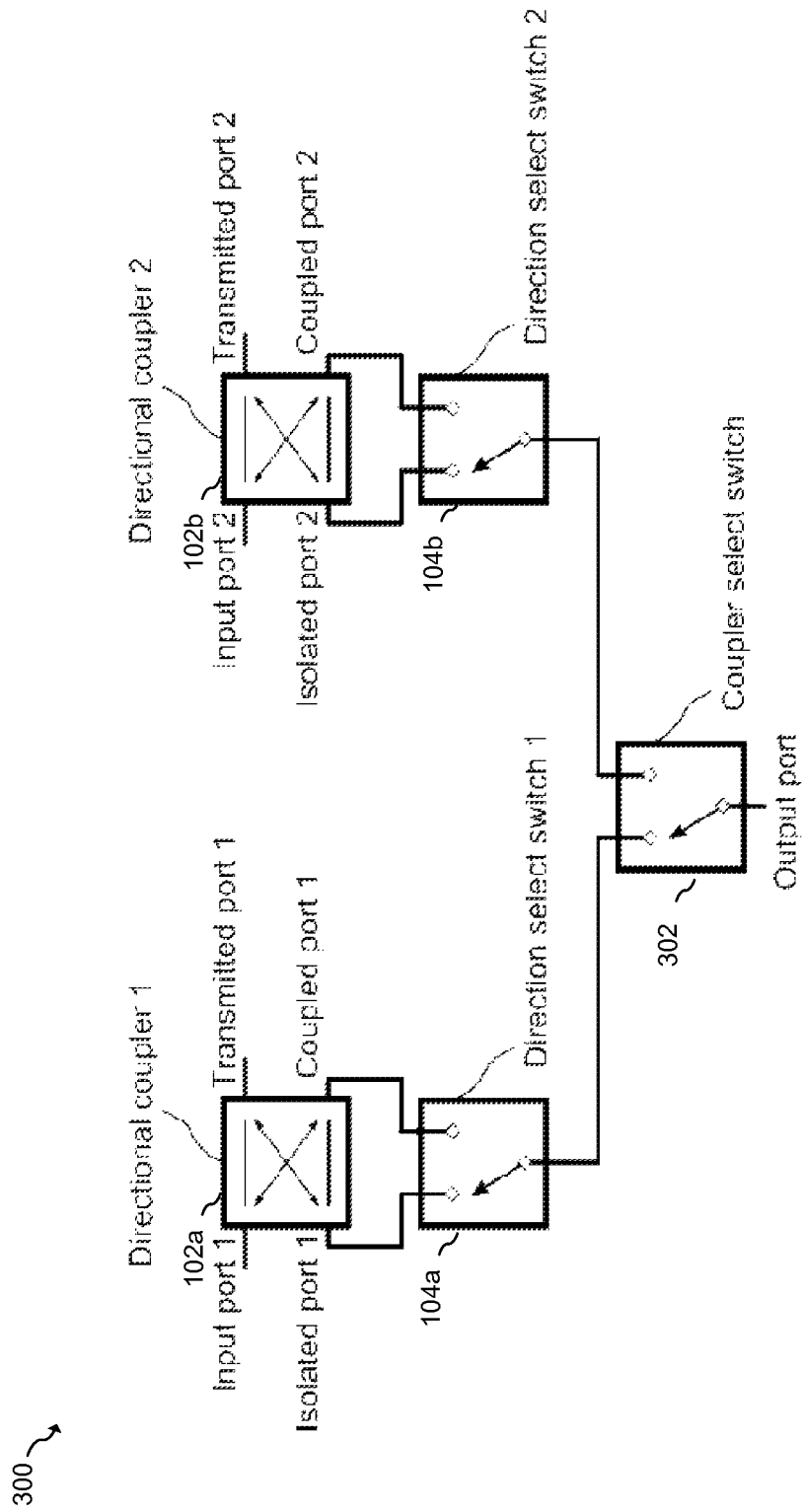
FIGS. 3a-3b illustrate embodiment directional coupler systems that utilize a plurality of directional couplers.

FIG. 3a illustrates embodiment directional coupler system 300 that includes two directional couplers 102a and 102b, the isolated ports and coupled ports of which are multiplexed to a single output port via direction select switch 104a, direction select switch 104b, and coupler select switch 302. As shown, directional coupler 102a includes a first input port, a first transmitted port, a first coupled port, and a first isolated port, and directional coupler 102b includes a second input port, a second transmitted port, a second coupled port, and second isolated port. A first RF signal passes through directional coupler 102a via the first input and first transmitted ports, and a second RF signal passes through directional coupler 102b via the second input and second transmitted ports.

The isolated and coupled ports of directional coupler 102a are combined into one signal by direction select switch 104a, and the isolated and coupled ports of directional coupler 102b are combined into one signal by direction select switch 104b. Coupler select switch 302 commutes either the output of direction select switch 104a or the output of direction select switch 104b to an output port. All blocks in directional coupler system 300 may either be monolithically integrated together on a single die or implemented in separate chips.

Figure 3B:
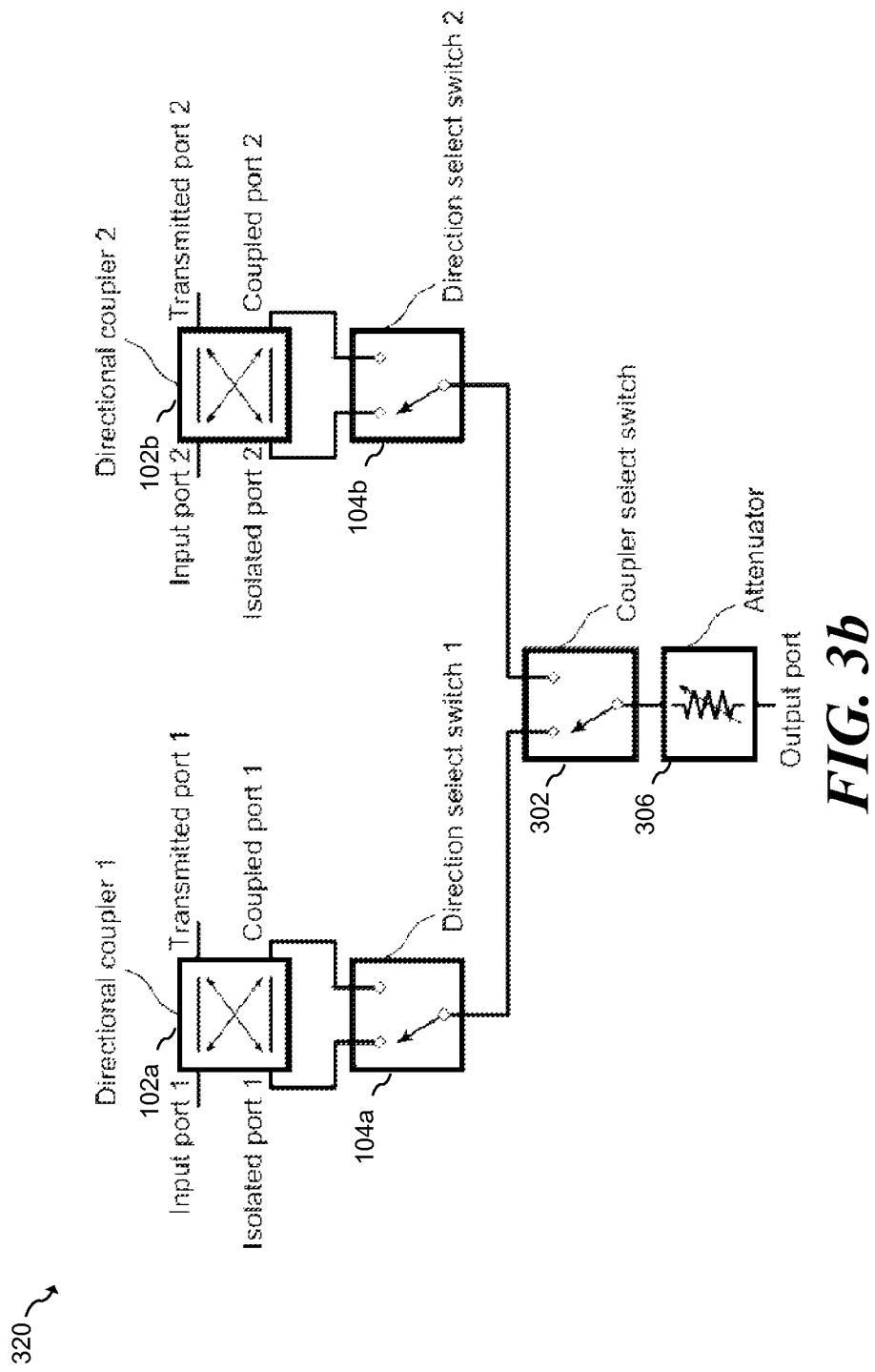

FIG. 3b illustrates directional coupler system 320 according to an embodiment of the present invention. As shown, directional coupler system 320 is similar to directional coupler system 300 with the addition of attenuator 306 coupled to the output of coupler select switch 302. Attenuator 306 may be analog or digitally tunable. All blocks in directional coupler system 320 may either be monolithically integrated together on a single die or implemented in separate chips.

Figure 4A:
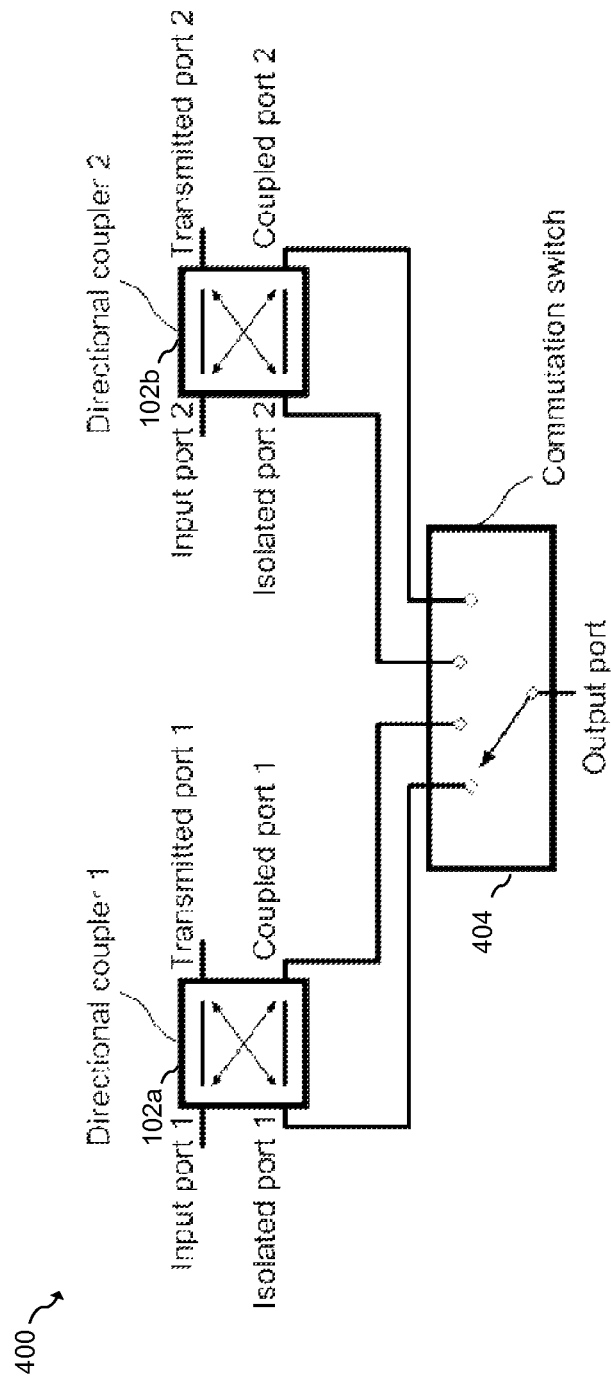
FIGS. 4a-c illustrate embodiment directional coupler systems that utilize a plurality of directional couplers and a commutation switch.

FIG. 4a illustrates directional coupler system 400 according to an embodiment. As shown, directional coupler system 400 includes directional coupler iota, directional coupler 102*b* and commutation switch 404. By using commutation switch 404, the isolated and coupled port of any number of directional couplers may be routed to the output port of commutation switch 404. Again, all blocks in directional coupler system 400 may either be monolithically integrated together on a single die or implemented in separate chips.

Figure 4B:
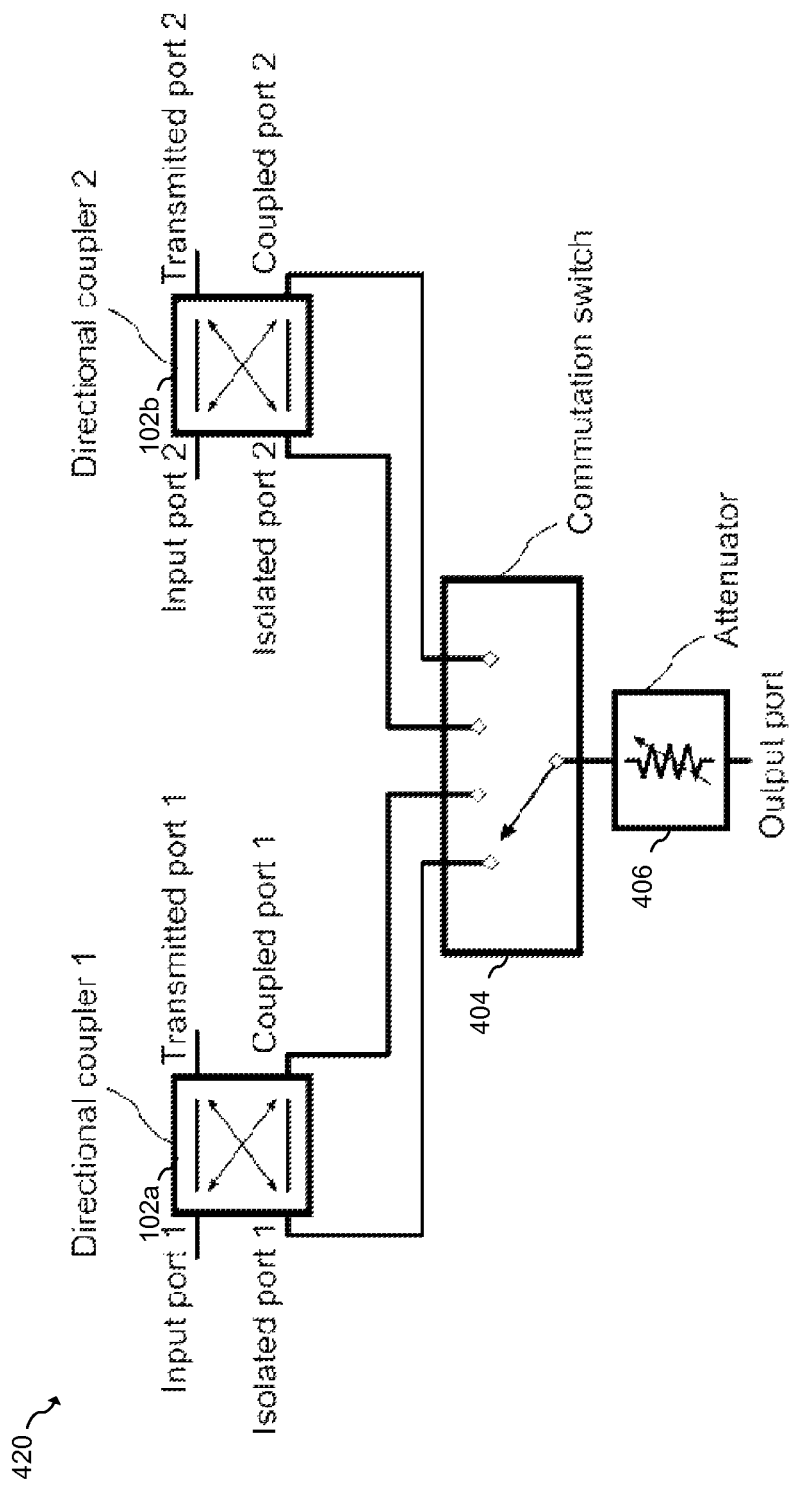

FIG. 4*b* illustrates directional coupler system 420 according to a further embodiment. As shown, directional coupler system 420 is similar to directional coupler system 400 with the addition of attenuator 406 coupled to the output of commutation switch 404. Attenuator 406 may be analog or digitally tunable. All blocks in directional coupler system 420 may either be monolithically integrated together on a single die or implemented in separate chips.

Figure 4C:
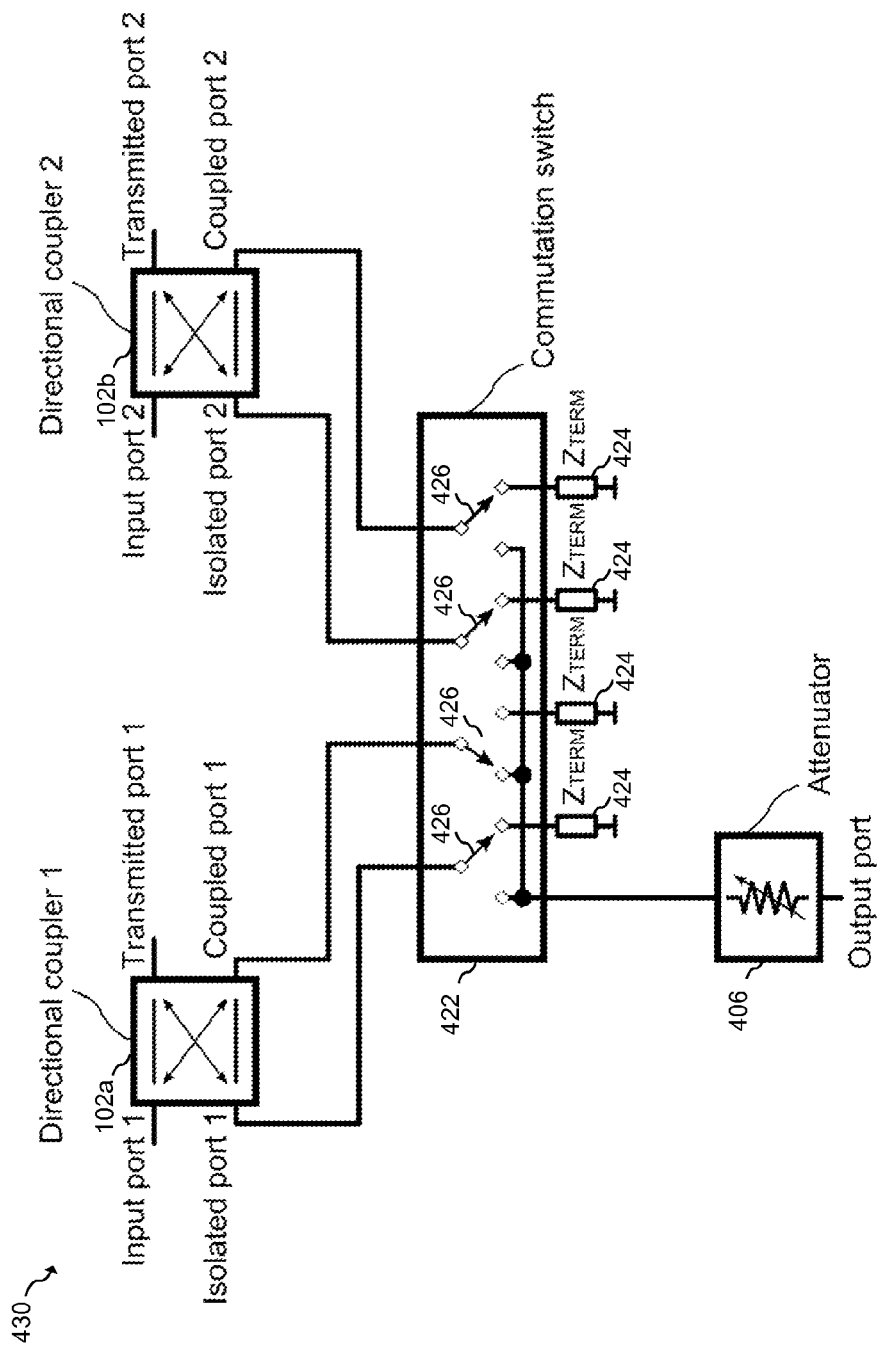

FIG. 4*c* illustrates directional coupler system 430 according to another embodiment of the present invention that includes directional coupler 102*a*, directional coupler 102*b*, commutation switch 422, termination impedances 424 and attenuator 406. As shown, commutation switch 422 includes switches 426 that select between one of termination impedances 424 and one of the isolated or coupled ports of directional couplers 102*a* and 102*b*. Termination impedances 424 may be implemented, for example, using a 50 Ohm resistor or other resistance value approximately equal to the characteristic impedance of the system. In some embodiments, termination impedances 424 may be implemented using complex impedances implemented using resistors, capacitor, inductors, other device types or a combination thereof. Termination impedances 424 may be implemented using discrete external components or may be integrated on the same die as commutation switch 422 and/or other components within directional coupler system 430.

Figure 5:
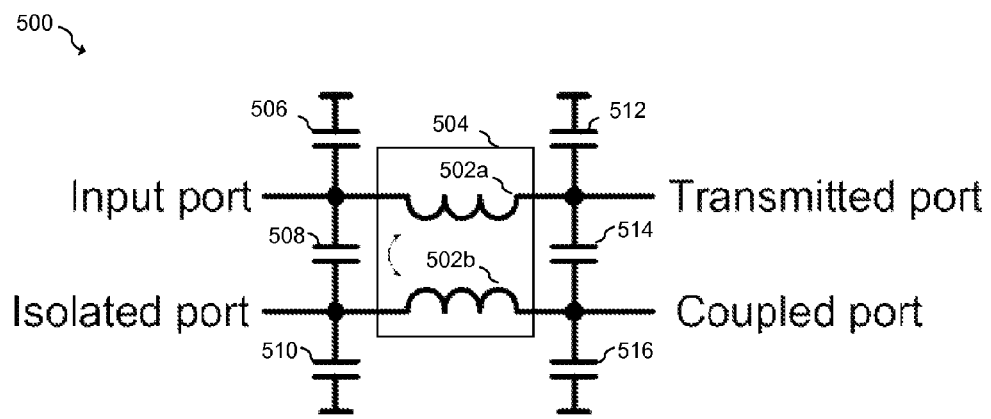
FIG. 5 illustrates an schematic of an embodiment directional coupler.

FIG. 5 illustrates directional coupler 500 that may be used to implement directional couplers in various embodiments. As shown, directional coupler 500 is implemented using transformer 504 with one winding 502*a* coupled between the input port and the transmitted port, and another winding 502*b* coupled between the isolated port and the coupled port and magnetically coupled to winding 502*a*. Transformer 504 may be implemented using circuits and systems known in the art. For example, in one embodiment, transformer 504 may be implemented using stacked or adjacent spiral inductors disposed on an integrated circuit. In a further embodiment, transformer 504 may be implemented using a stripline transformer disposed on a substrate. Alternatively, other structures may be used. In an embodiment, capacitors 506, 508, 510, 512, 514 and 516 are coupled to transformer 504.

Figure 6A:
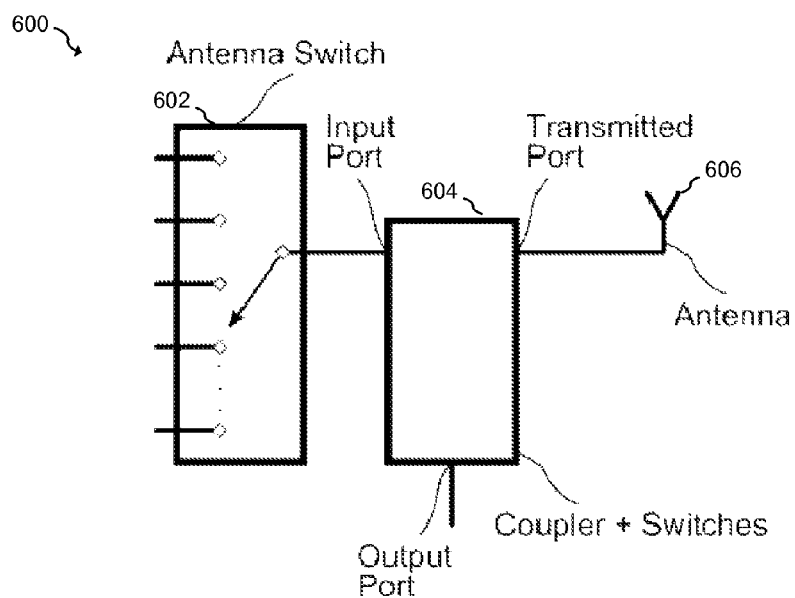
FIGS. 6a-6c illustrate RF systems that utilize embodiment directional coupler systems.
Figure 6B:
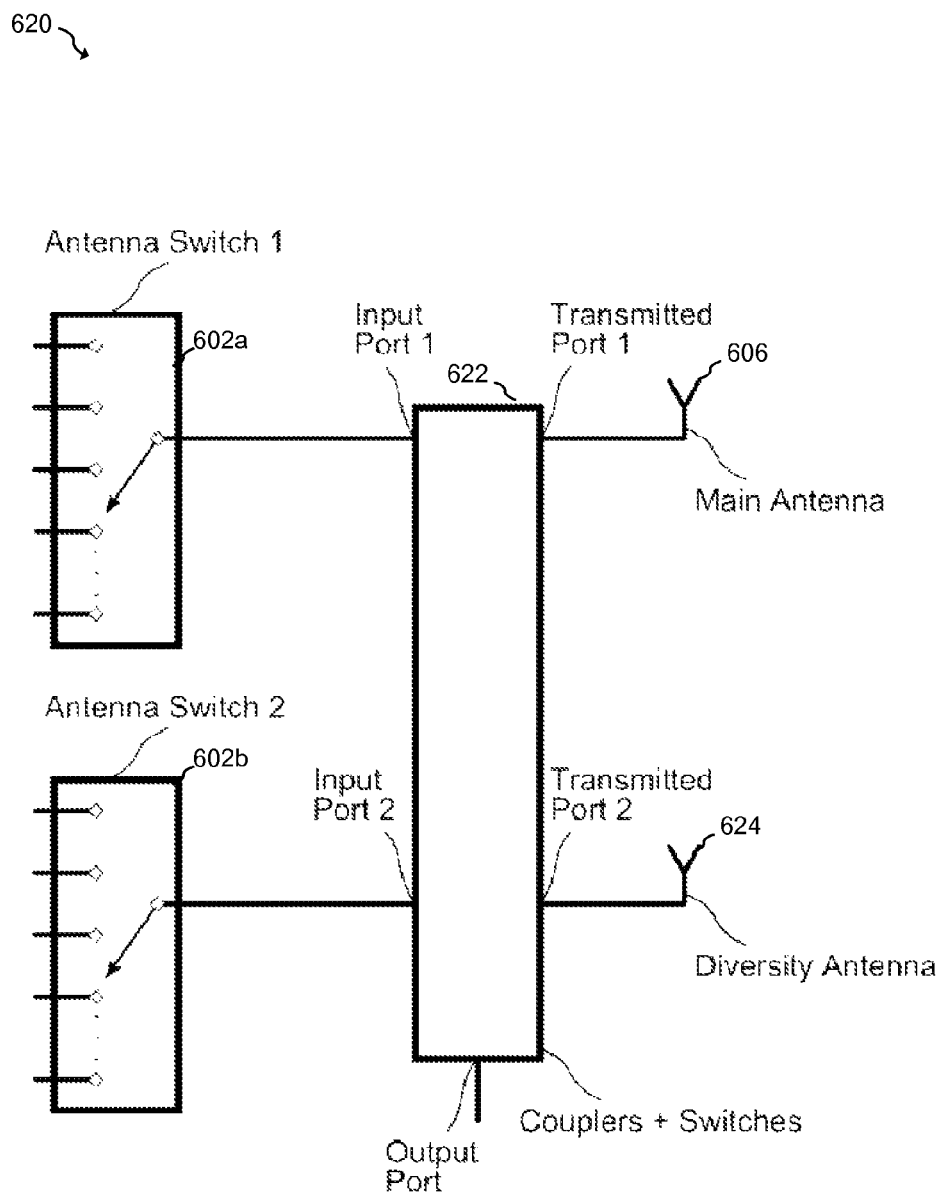
Figure 6C:
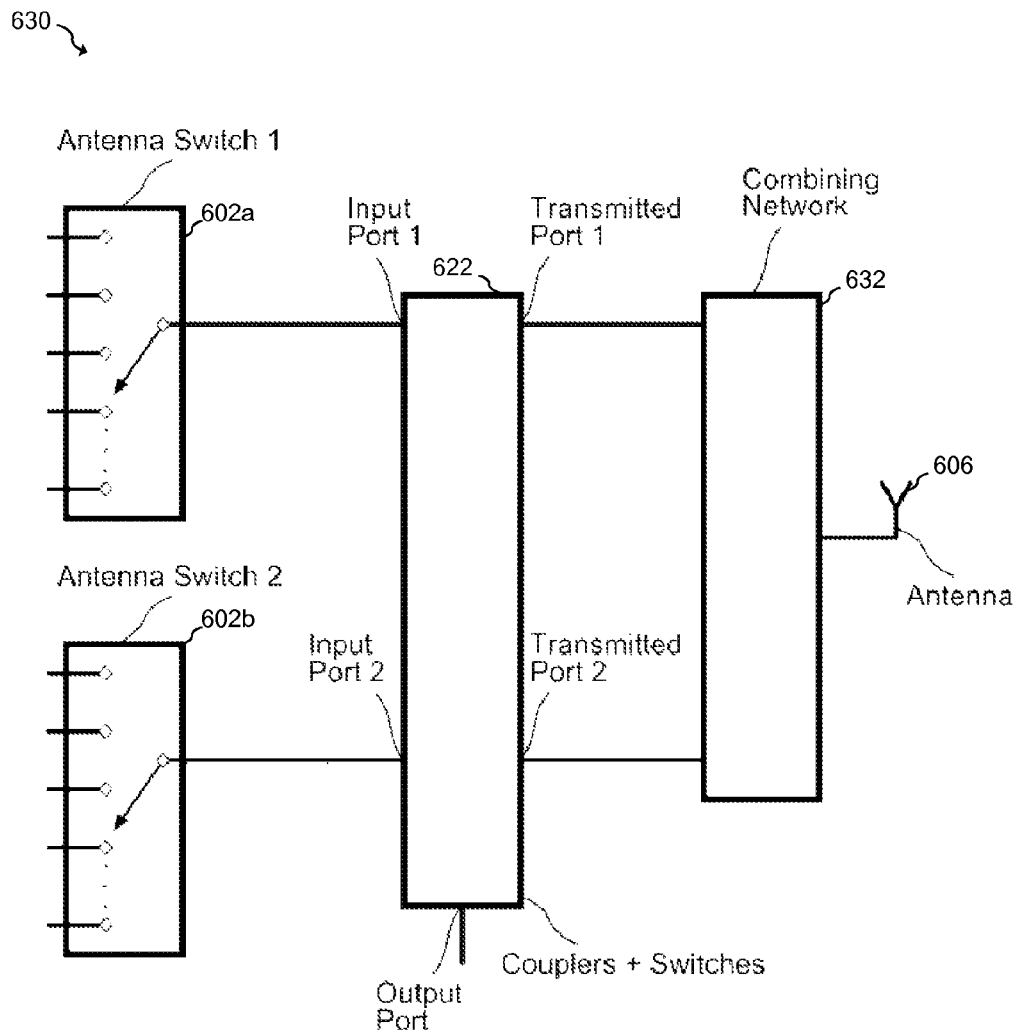

FIGS. 6*a*-6*c* illustrate various RF systems that utilize embodiment directional coupler systems. For example, FIG. 6*a* illustrates antenna system 600 that couples multiple channels from an RF front end to antenna 606 via antenna switch 602 and embodiment directional coupler system 604. Antenna switch 602 selects one from among a plurality of RF front-end input ports, and directional coupler system 604 provides access to coupled signals at its output port. Directional coupler system 604 may be implemented according to various embodiments described herein. In an embodiment, antenna system 600 may be incorporated within a portable RF device such as a cellular telephone. By selecting among various RF paths using antenna switch 602 a multi-standard cellular telephone may be supported. Embodiment directional coupler system 622 may be used for example to select among various coupled measurement paths in order to perform transmitted and reflected power measurements during system operation.

FIG. 6*b* illustrates embodiment antenna system 620 that may be used in an RF front-end system that uses multiple antennas. Antenna system 620 includes antenna switches 602*a* and 602*b*, embodiment directional coupler system 622 and antennas 606 and 624. In one embodiment, antenna 606 is configured as a main antenna and antenna 624 is configured as a diversity antenna. In an embodiment, directional coupler system 622 may be implemented using embodiment directional coupler system that utilizes a plurality of directional couplers in order to support simultaneous transmission of two signals to antennas 606 and 624.

FIG. 6*c* illustrates antenna system 630 that includes antenna switches 602*a* and 602*b*, embodiment directional coupler system 622, combining network 632 antenna 606. Here, antenna switch 602*a* selects one signal from among multiple signals in a first RF path and 602*b* selects one signal from among multiple signals in a second RF path. These two RF paths are combined via combining network 632 that may be implemented, using an RF power combiner, a diplexer, or other circuit known in the art. The output port of directional coupler system 622 may be coupled to a power detector (not shown) in order to measure the transmitted and reflected power in each of the various RF paths.

Figure 7A:
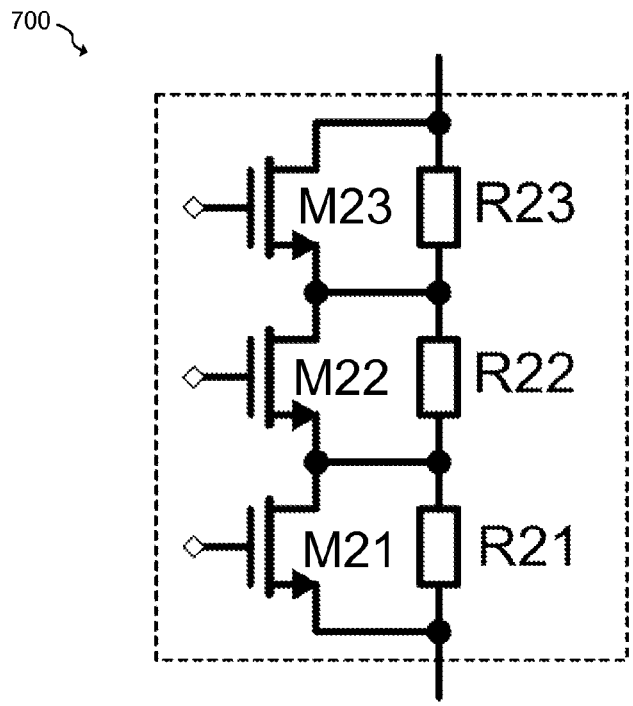
FIGS. 7a-7c illustrate embodiment selectable impedance circuits.

FIG. 7*a* illustrates tunable resistor 700 that may be used to implement various embodiment circuits, such as various attenuator circuits used in embodiment directional coupler systems. As shown, tunable resistor 700 includes resistors R21, R22 and R23 coupled in series with each other. In addition, transistor M21 is configured to bypass resistor R21, transistor M22 is configured to bypass resistor R22 and transistor M23 is configured to bypass R23. During operation transistors M21, M22 and M23 are turned on and off in various combinations in order to provide an adjustable resistance value. When transistors M21, M22 and M23 are all turned off, tunable resistor 700 has a maximum resistance value that may be decreased and adjusted by selectively turning on and off transistors M21, M22 and M23 to effect a change in resistance.

Figure 7B:
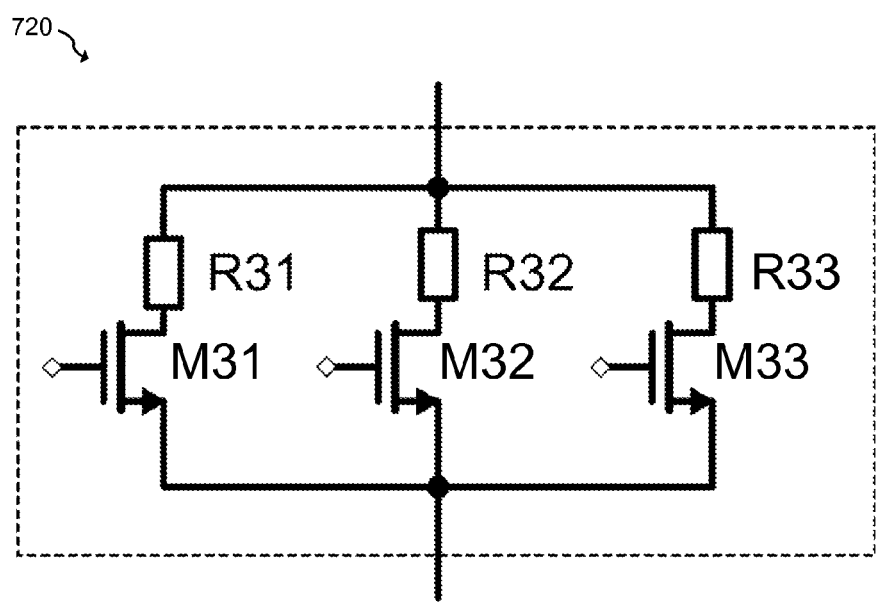

FIG. 7*b* illustrates tunable resistor 720 that may be used to implement various embodiment circuits, such as various attenuator circuits used in embodiment directional coupler systems. As shown, tunable resistor 720 includes resistors R31, R32 and R33 coupled in parallel with each other, wherein each one of resistors R31, R32 and R33 are coupled in series with transistors M31, M32 and M33, respectively. The resistance of tunable resistor 720 may be adjusted selectively turning on and off transistors M21, M32 and M33.

Figure 7C:
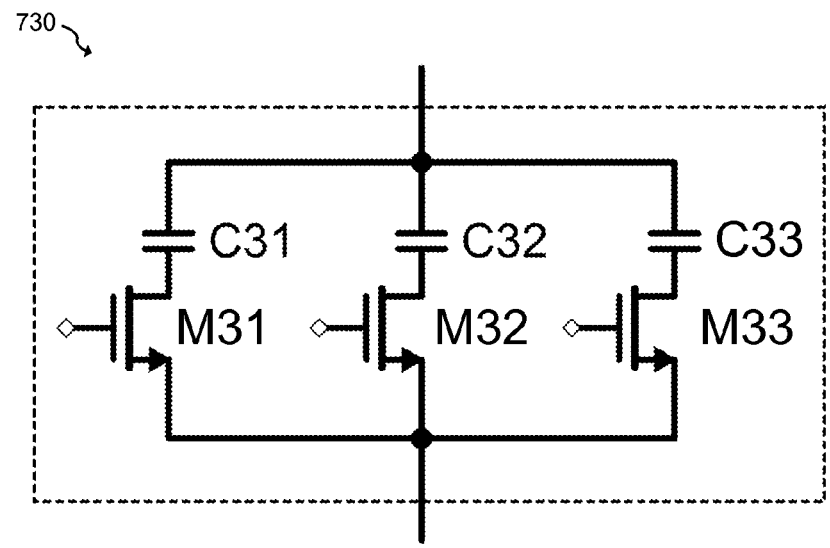

FIG. 7*c* illustrates tunable capacitor 730 that may be used to implement various embodiment circuits, such as various attenuator circuits used in embodiment directional coupler systems. As shown, tunable capacitor 730 includes capacitors C31, C32 and C33 coupled in parallel with each other, wherein each one of capacitors C31, C32 and C33 are coupled in series with transistors M31, M32 and M33, respectively. The capacitance of tunable capacitance 730 may be adjusted selectively turning on and off transistors M21, M32 and M33. These transistors may be turned on and off by applying a HIGH and LOW signal to the gates of these transistors.

Figure 8A:
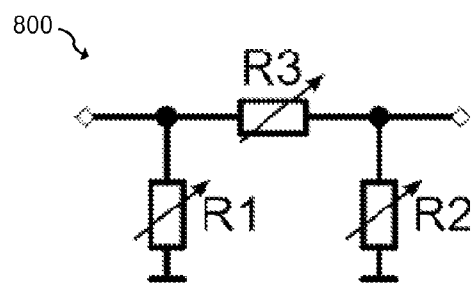
FIGS. 8a-8d illustrate embodiment adjustable attenuator circuits.

FIG. 8*a* illustrates a PI attenuator 800 that may be used to implement various embodiment attenuation circuits. PI attenuator 800 includes adjustable impedances R1, R2 and R3 that may be implemented, for example using the various adjustable impedance elements shown in FIGS. 7*a*-7*c*. In one example, R1 and R2 may be implemented using the adjustable parallel tunable resistor 720 illustrated in FIG. 7*b* and resistor R3 may be implemented using the adjustable series resistor 700 illustrated in FIG. 7a.

Figure 8B:
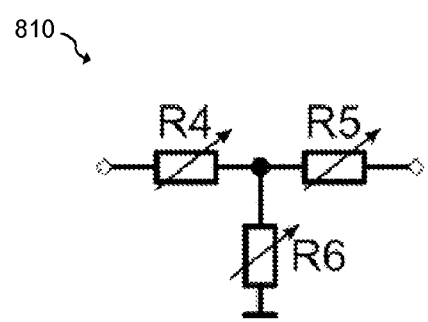

FIG. 8b illustrates a Y attenuator 810 that may be used to implement various embodiment attenuation circuits. Y attenuator 810 includes adjustable impedances R4, R5 and R6 that may be implemented, for example using the various adjustable impedance elements shown in FIGS. 7a-7c.

Figure 8C:
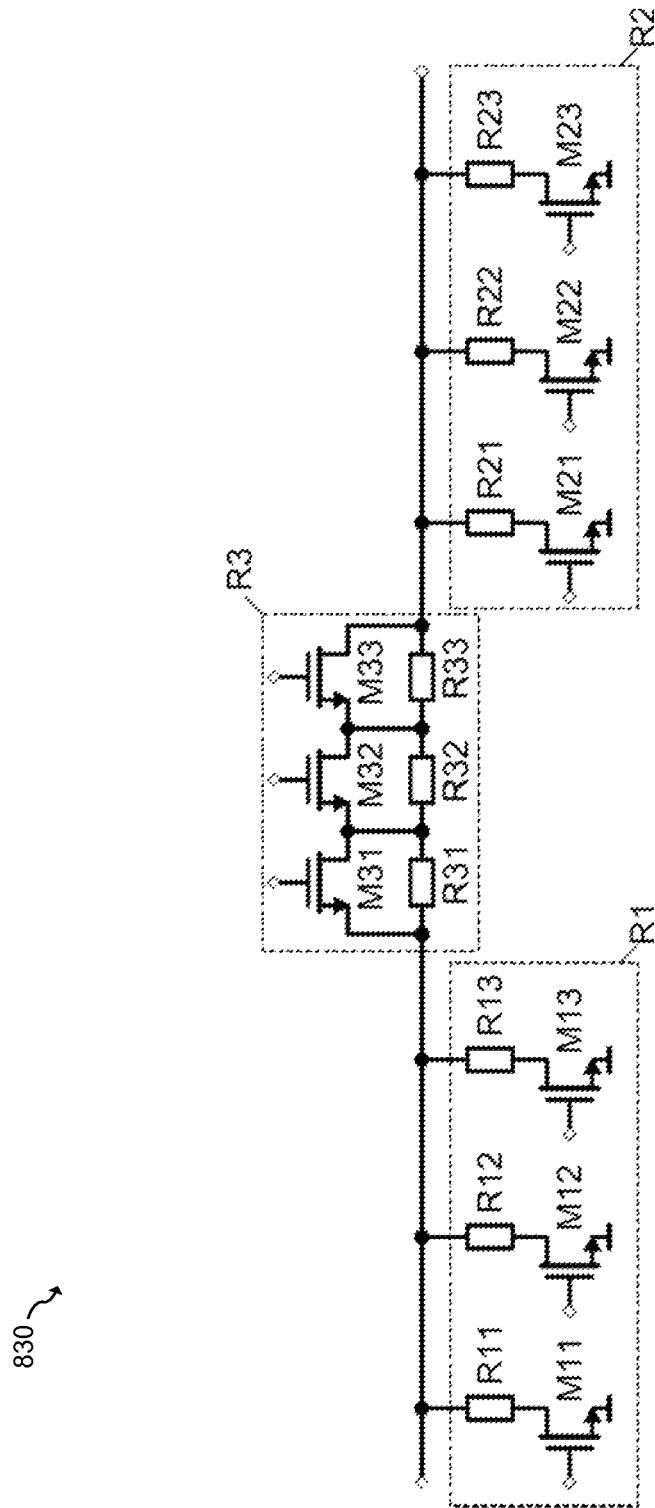
Figure 8D:
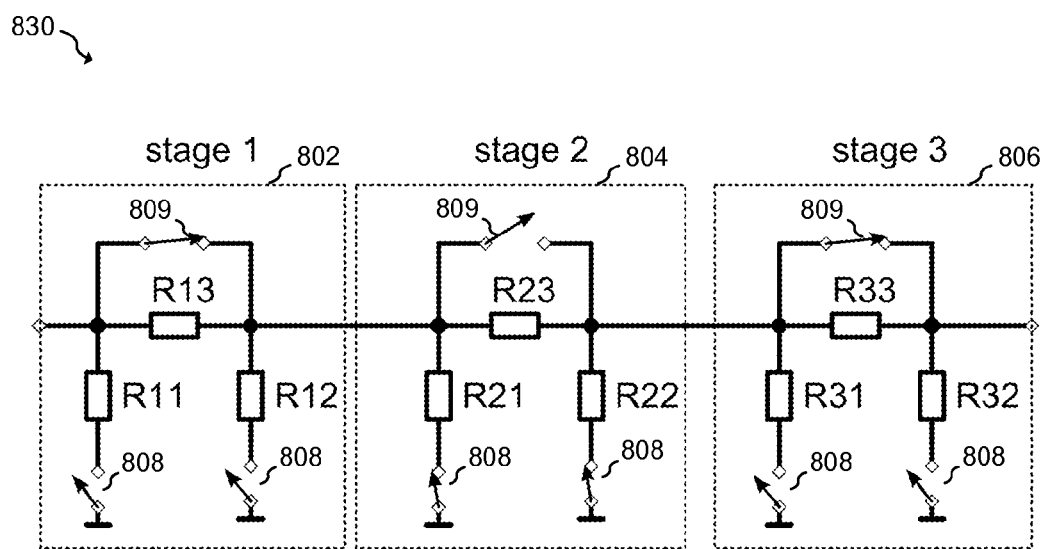

FIG. 8c illustrates an embodiment attenuator 830 that includes three PI attenuator stages 802, 804 and 806. The attenuation of attenuator 830 may be adjusted by tuning on and off switches 808 and switches 809 coupled to the various resistors in each attenuation stage. Each of the switches 808 and 809 may be implemented using RF switching circuits known in the art. During operation, one or more of stages 802, 804 and 806 may be bypassed by closing respective switch 809 and opening switches 808. Conversely, each stage may be activated by opening respective switch 809 and closing switches 808.

Figure 9A:
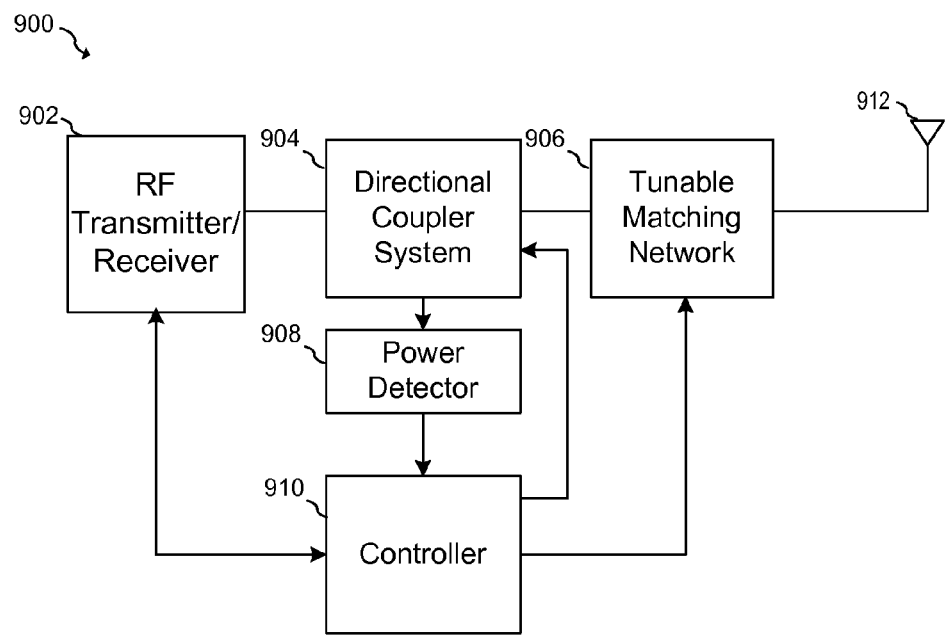
FIGS. 9a-9d illustrate further RF systems that utilize embodiment directional coupler systems.
Figure 9B:
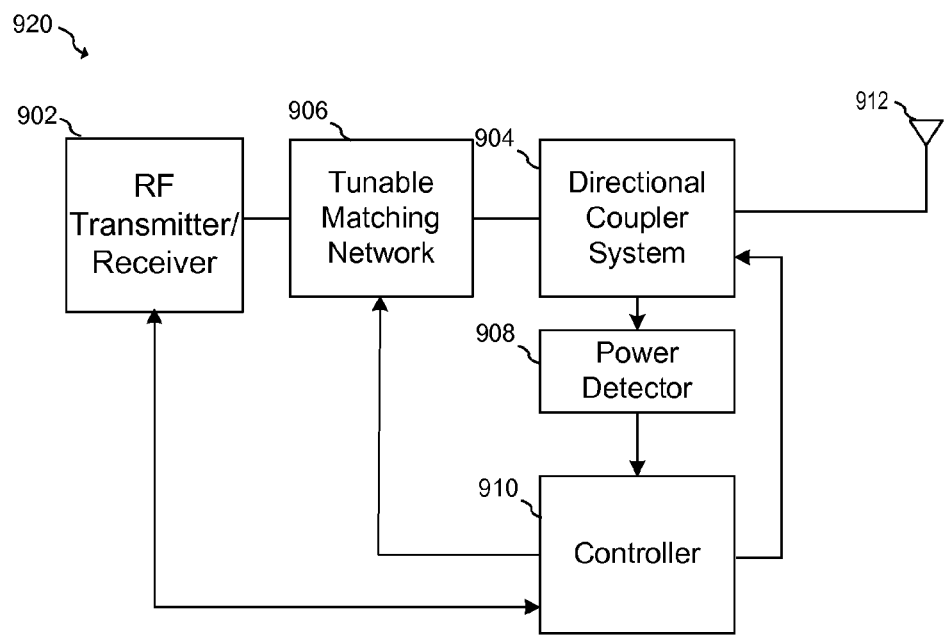

FIG. 9a illustrates RF system 900 according to an embodiment of the present invention. System 900 includes RF transceiver 902 coupled to antenna 912 via embodiment directional coupler system 904 and tunable matching network 906. The output port of directional coupler 904 is coupled to power detector 908, the output of which is coupled to controller 910. In an embodiment, controller 910 adjusts tunable matching network 906 according to the digitized output of power detector 908. When directional coupler 904 detects an impedance mismatch between the RF transceiver 902 and the input to tunable matching network 906, controller 910 adjusts tunable matching network 906 until the measured its mismatch in impedance falls below a predetermined threshold in some embodiments. In some embodiments, controller 910 may be implemented, for example, using a processor, microcontroller, or dedicated system logic. During operation, controller 910 selects which output port of the directional coupler is routed to power detector 908 depending on the measurement being made. RF system 900 may be implemented, for example, in the front end of a cellular telephone, wireless local area network transceiver, or other radio frequency system. In some embodiments, tunable matching network 906 is coupled between RF transceiver 902 and directional coupler 904, as shown in FIG. 9b with respect to system 920.

Figure 9C:
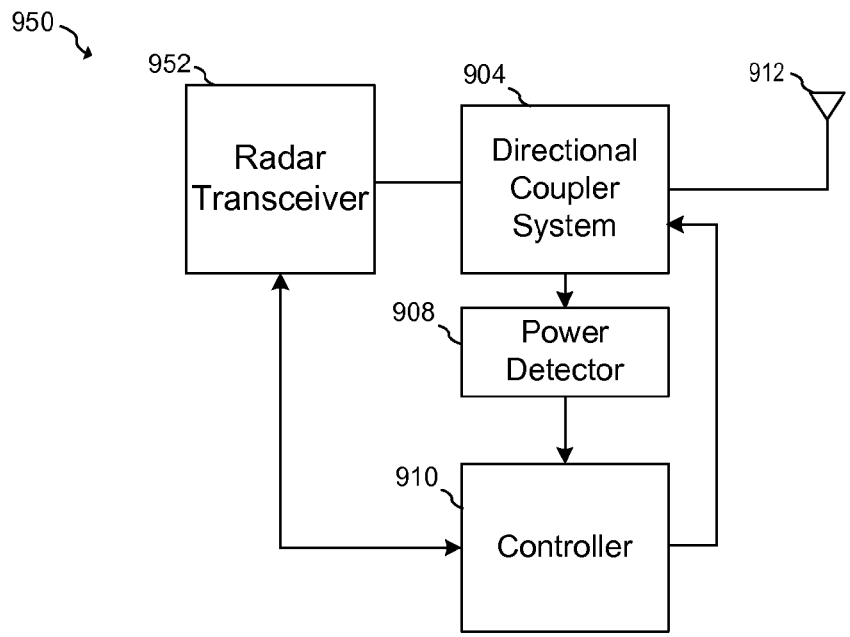

FIG. 9c illustrates embodiment radar system 950 according to another embodiment of the present invention. System 950 includes radar transceiver 952 coupled to antenna 912 via embodiment directional coupler system 904. The output of directional coupler system 904 is coupled to the controller 910 via power detector 908. In an embodiment, directional coupler system 904 measures an incident signal from antenna 912 that may represent a reflected radar pulse. System 950 may be used, for example, a radar system such as automotive or proximity radar systems. Directional coupler system 904 may be implemented, for example, using embodiment directional couplers systems disclosed herein. Other example systems that may utilize embodiment reflection measurement circuits include power monitoring in planar inverted F antenna (PIFA) feed-point tuners.

Figure 9D:
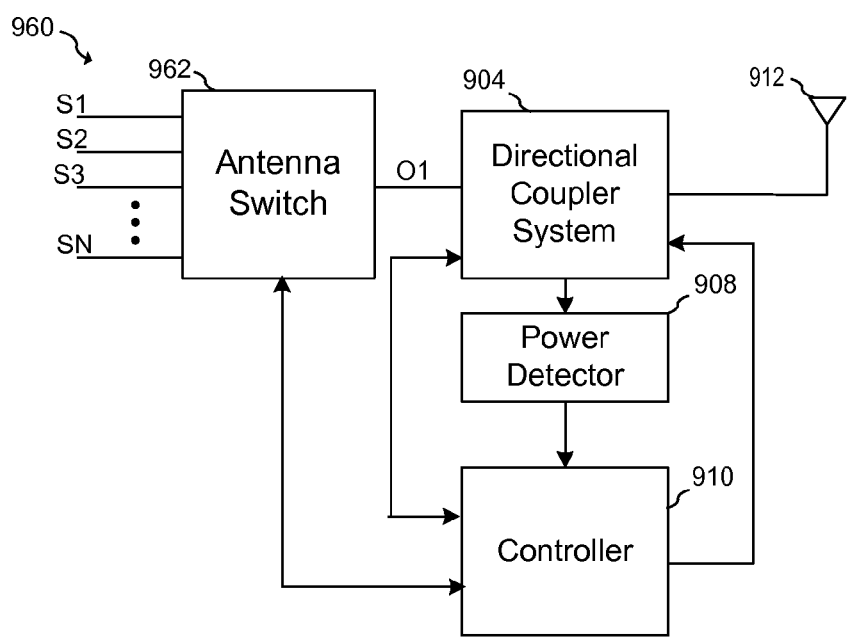

FIG. 9d illustrates embodiment system 960 that includes antenna switch 962 coupled to antenna 912 via embodiment directional coupler system 904. Antenna switch 962 is configured to select and couple one input from among inputs S1 through SN to output node O1. The output port of directional coupler 904 is coupled to controller 910 via power detector 908. System 960 may be used, for example, to measure transmitted and reflected power in the forward and reverse direction by selecting a position of the polarity switch within directional coupler 904. The output of directional coupler 904 may be further used to perform envelope tracking and antenna tuning.

It should be appreciated that the embodiment shown in FIGS. 9a-d are just four examples of the many embodiment systems that may be implemented using embodiment directional couplers.

Figure 10:
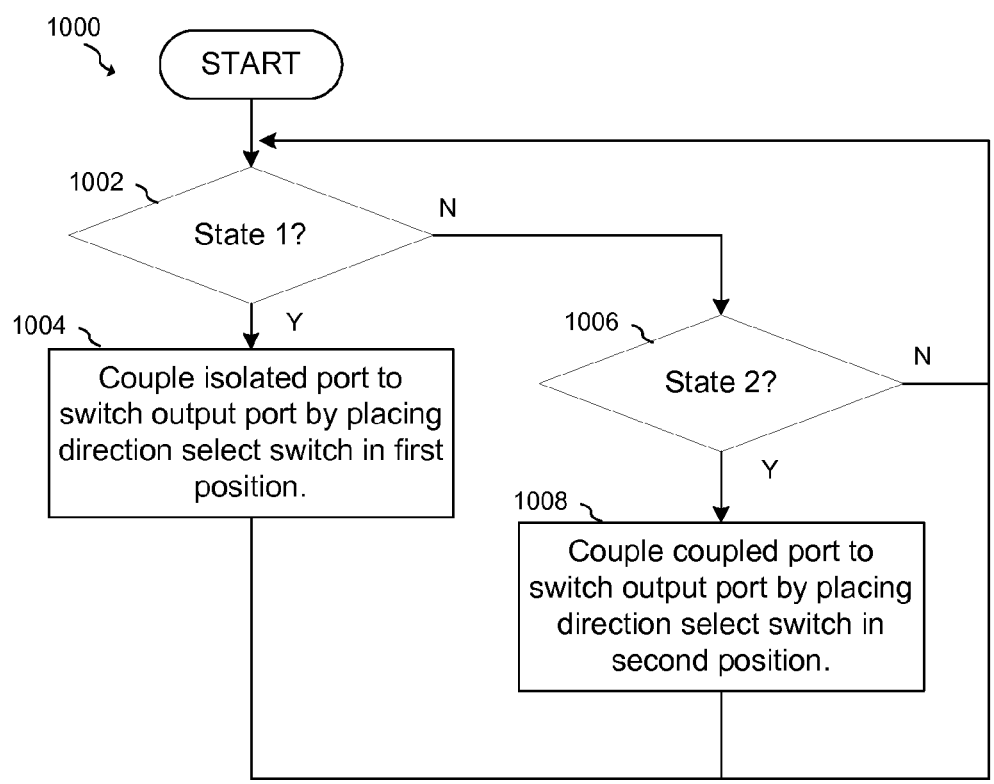
FIG. 10 illustrates a block diagram of an embodiment method.

FIG. 10 illustrates a flow chart of embodiment method 1000 of operating a circuit that includes a directional coupler having an input port, a transmitted port, an isolated port and a first coupled port, and a direction select switch having a first switch input port coupled to the first isolated port, a second switch input port coupled to the first coupled port, and a switch output port, such that the directional coupler and the direction select switch are disposed on a same substrate. The method first determines whether the circuit is in a first state in step 1002. If the circuit is in the first state, the isolated port is coupled to the switch output by placing the direction select switch in a first position in step 1004. If the circuit is not in the first state, then the method determines whether the circuit is in the second state in step 1006. If so, the coupled port is coupled to the switch output by placing the direction select switch in the second position in step 1008. Once steps 1004, 1006 and 1008 have been completed, the method returns to steps 1002 and 1006 to determine whether circuit is in the first and second states.

Embodiments of the present invention are summarized here. Other embodiments can also be understood from the entirety of the specification and the claims filed herein. One general aspect includes a circuit having a first directional coupler including a first input port, a first transmitted port, a first isolated port and a first coupled port, the first directional coupler disposed on a first substrate; and a first direction select switch having a first switch input port coupled to the first isolated port, a second switch input port coupled to the first coupled port, and a first switch output port, where the first direction select switch is disposed on the first substrate along with the directional coupler.

Implementations may include one or more of the following features. The circuit where the first directional coupler is disposed on a first integrated circuit, the first direction select switch is disposed on a second integrated circuit, and the first integrated circuit and the second integrated circuit are disposed on the first substrate. The circuit where the first substrate includes a semiconductor substrate of a first integrated circuit. The circuit where the first direction select switch includes a first switch configured to couple the isolated port to the output port in a first switch setting and configured to couple the coupled port to the output port in a second switch setting. In some embodiments, the first direction select switch further includes a second switch that couples a first termination to the first coupled port in the first switch setting and couples a second termination to the first isolated port in the second switch setting.

In an embodiment, the circuit further includes an attenuator coupled to the first switch output port. The attenuator may include, for example, a plurality of resistors coupled to a plurality of switches. The plurality of resistors may be coupled in series, and the each of the plurality of resistors may be configured to bypass a corresponding resistor of the plurality of resistors. In some embodiments, the plurality of resistors is coupled in series with a corresponding switch of the plurality of switches to form switch-resistor branch. In addition, the attenuator may include a plurality of switch-resistors branches coupled in parallel.

In an embodiment, the circuit further includes a second directional coupler having a second input port, a second transmitted port, a second isolated port and a second coupled port, the second directional coupler disposed on the first substrate; a second direction select switch having a third switch input port coupled to the second isolated port, a third switch input port coupled to the second coupled port, and a second switch output port, where the second direction select switch is disposed on the first substrate along with the second directional coupler; and a coupler select switch having a first coupler select input coupled to the first switch output of the first direction select switch, a second coupler select input coupled to the second switch output of the second direction select switch and a select output. In some embodiments, the circuit further includes an attenuator coupled to the second switch output port. A first antenna may be coupled to the first transmitted port, and a second antenna may be coupled to the second transmitted port. In an embodiment, a first antenna switch is coupled to the first input port, and a second antenna switch coupled to the second input port. The circuit may further include an antenna coupled to the first transmitted port, as well as an antenna switch coupled to the first input port.

Another general aspect includes a circuit having a first directional coupler including a first input port, a first transmitted port, a first isolated port and a first coupled port, the first directional coupler disposed on a first substrate; and a second directional coupler including a second input port, a second transmitted port, a second isolated port and a second coupled port, the second directional coupler disposed on the first substrate; and a commutation switch having a first commutation input coupled to the first isolated port, a second commutation input coupled to the first coupled port, a third commutation input coupled to the second isolated port and a fourth commutation input coupled to the second coupled port, the commutation switch being disposed on the first substrate, and a commutation output port.

Implementations may include one or more of the following features. The circuit further including an attenuator coupled to the commutation output port and/or the circuit where first substrate includes an integrated circuit. In some embodiments, the commutation switch includes: a first switch configured to selectively couple the first commutation input port to one of the commutation output port and a first termination port; a second switch configured to selectively couple the second commutation input port to one of the commutation output port and a second termination port; a third switch configured to selectively couple the third commutation input port to one of the commutation output port and a third termination port; and a fourth switch configured to selectively couple the fourth commutation input port to one of the commutation output port and a fourth termination port.

In some embodiments, the circuit further includes: a first termination impedance coupled to the first termination port; a second termination impedance coupled to the second termination port; a third termination impedance coupled to the third termination port; and a fourth termination impedance coupled to the fourth termination port. The first termination impedance may include a first termination resistor; the second termination impedance may include a second termination resistor; the third termination impedance may include a third termination resistor; and the fourth termination impedance may include a fourth termination resistor.

A further general aspect includes a method of operating a circuit including a first directional coupler having a first input port, a first transmitted port, a first isolated port and a first coupled port, and a first direction select switch having a first switch input port coupled to the first isolated port, a second switch input port coupled to the first coupled port, and a first switch output port, where the first directional coupler and the first direction select switch are disposed on a same substrate. The method includes: in a first state, coupling the first isolated port to the first switch output port including placing a first switch of the first direction select switch in a first position; and in a second state, coupling the first coupled port to the first switch output including placing the first switch of the first direction select switch in a second position.

Implementations may include one or more of the following features. The method further including: in the first state, coupling the first coupled port to a first termination port including placing a second switch of the first direction select switch in the first position; and in the second state, coupling the first isolated port to a second termination port including placing the second switch of the first direction select switch in the second position. The method may further include receiving a signal at the first input port and measuring a power at the first switch output in the second state. In some embodiments, the method further includes measuring a power at the first switch output in the first state.

Advantages of some embodiment directional couplers include the ability to monitor the power of an RF signal in both the forward and reverse direction using only a single coupled output port. Another advantage includes the ability to integrate such a system on a single integrated circuit, or as multiple circuits disposed on a substrate.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:
1. A circuit comprising:
a first directional coupler comprising a first input port, a first transmitted port, a first isolated port and a first coupled port, the first directional coupler disposed on a first substrate;
a second directional coupler comprising a second input port, a second transmitted port, a second isolated port and a second coupled port, the second directional coupler disposed on the first substrate; and
a commutation switch having a first commutation input coupled to the first isolated port, a second commutation input coupled to the first coupled port, a third commutation input coupled to the second isolated port and a fourth commutation input coupled to the second coupled port, and a commutation output port, the commutation switch being disposed on the first substrate.

2. The circuit of claim 1, further comprising an attenuator coupled to the commutation output port.

3. The circuit of claim 2, wherein the attenuator comprises a plurality of resistors coupled to a plurality of switches.

4. The circuit of claim 3, wherein the resistors of the plurality of resistors are coupled in series, and each of the plurality of switches is configured to bypass a corresponding resistor of the plurality of resistors.

5. The circuit of claim 3, wherein each of the plurality of resistors are coupled in series with a corresponding switch of the plurality of switches to form switch-resistor branch, and wherein the attenuator comprises a plurality of switch-resistor branches coupled in parallel.

6. The circuit of claim 1, further comprising a first antenna coupled to the first transmitted port, and a second antenna coupled to the second transmitted port.

7. The circuit of claim 6, further comprising a first antenna switch coupled to the first input port, and a second antenna switch coupled to the second input port.

8. The circuit of claim 6, wherein the first antenna is configured as a main antenna, and the second antenna is configures as a diversity antenna.

9. The circuit of claim 1, wherein first substrate comprises an integrated circuit.

10. The circuit of claim 1, wherein the commutation switch comprises:
a first switch configured to selectively couple the first commutation input to one of the commutation output port and a first termination port;
a second switch configured to selectively couple the second commutation input to one of the commutation output port and a second termination port;
a third switch configured to selectively couple the third commutation input to one of the commutation output port and a third termination port; and
a fourth switch configured to selectively couple the fourth commutation input to one of the commutation output port and a fourth termination port.

11. The circuit of claim 10, further comprising:
a first termination impedance coupled to the first termination port;
a second termination impedance coupled to the second termination port;
a third termination impedance coupled to the third termination port; and
a fourth termination impedance coupled to the fourth termination port.

12. The circuit of claim 11, wherein:
the first termination impedance comprises a first termination resistor;
the second termination impedance comprises a second termination resistor;
the third termination impedance comprises a third termination resistor; and
the fourth termination impedance comprises a fourth termination resistor.

13. The circuit of claim 1, further comprising:
a first antenna switch coupled to the first input port;
a second antenna switch coupled to the second input port; and
a combining network having a first port coupled to the first transmitted port, a second port coupled to the second transmitted port, and a third port coupled to an antenna port.

14. The circuit of claim 13, further comprising an antenna coupled to the third port of the combining network.

15. The circuit of claim 1, wherein the first directional coupler, the second directional coupler and the commutation switch are integrated on separate chips.

16. The circuit of claim 1, wherein the first directional coupler, the second directional coupler and the commutation switch are integrated on a monolithic integrated circuit.

17. A method of operating a circuit comprising a first directional coupler having a first input port, a first transmitted port, a first isolated port and a first coupled port, the first directional coupler disposed on a first substrate, a second directional coupler having a second input port, a second transmitted port, a second isolated port and a second coupled port, and a commutation switch having a first commutation input coupled to the first isolated port, a second commutation input coupled to the first coupled port, a third commutation input coupled to the second isolated port and a fourth commutation input coupled to the second coupled port, and a commutation output, wherein the first directional coupler, the second directional coupler and the commutation switch are disposed on a same substrate, and the method comprises:
in a first state, coupling a first one of the first isolated port, the first coupled port, the second isolated port and the second coupled port to the commutation output by placing a first switch of the commutation switch in a first position; and
in a second state, coupling a second one of the first isolated port, the first coupled port, the second isolated port and the second coupled port to the commutation output by placing a second switch of the commutation switch in the first position.

18. The method of claim 17, further comprising:
in the first state, coupling remaining ones of the first isolated port, the first coupled port, the second isolated port and the second coupled port to respective termination resistors by placing a respective second switch, a respective third switch and a respective fourth switch in a second position opposite the first position.

19. The method of claim 18, further comprising:
in the second state, coupling remaining ones of the first isolated port, the first coupled port, the second isolated port and the second coupled port to respective termination resistors by placing the respective first switch, a respective third switch and a respective fourth switch in a second position opposite the first position.

20. The method of claim 17, further comprising receiving a signal at the first input port and measuring a power at the commutation output in the first state.

21. A directional coupler module comprising:
a first directional coupler comprising a first input port, a first transmitted port, a first isolated port and a first coupled port;
a second directional coupler comprising a second input port, a second transmitted port, a second isolated port and a second coupled port; and
a commutation switch having a first commutation input coupled to the first isolated port, a second commutation input coupled to the first coupled port, a third commutation input coupled to the second isolated port and a fourth commutation input coupled to the second coupled port, and a commutation output port, wherein the first directional coupler, the second directional coupler and the commutation switch are disposed on a same substrate.

22. The directional coupler module of claim 21, wherein:
the first directional coupler is disposed on a first integrated circuit;
the second directional coupler is disposed on a second integrated circuit;
the commutation switch is disposed on a third integrated circuit; and
the first integrated circuit, the second integrated circuit and the third integrated circuit are disposed on a module substrate.

23. The directional coupler module of claim 21, wherein the first directional coupler, the second directional coupler and the commutation switch are disposed on a single monolithic integrated circuit.

* * * * *